United States Patent
Ghosh et al.

(10) Patent No.: US 11,500,789 B2
(45) Date of Patent: Nov. 15, 2022

(54) AUTOMATIC THRESHOLD ADJUSTMENT FOR USB POWER DELIVERY TO WORK WITH CABLES OUT OF SPECIFICATION

(71) Applicant: Microchip Technology Incorporated, Chandler, AZ (US)

(72) Inventors: Atish Ghosh, Austin, TX (US); Hari Kishore Rajendran, Tamil Nadu (IN); Sandhya Asokan, Tamilnadu (IN)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/229,083

(22) Filed: Apr. 13, 2021

(65) Prior Publication Data

US 2022/0327065 A1    Oct. 13, 2022

(51) Int. Cl.
*G06F 13/10* (2006.01)
*G06F 13/42* (2006.01)

(52) U.S. Cl.
CPC ........ *G06F 13/102* (2013.01); *G06F 13/4282* (2013.01); *G06F 2213/0042* (2013.01)

(58) Field of Classification Search
CPC ............... G06F 13/102; G06F 13/4282; G06F 2213/0042
See application file for complete search history.

(56) References Cited

U.S. PATENT DOCUMENTS

| | | | | |
|---|---|---|---|---|
| 9,748,782 B1* | 8/2017 | Sheng | ............ | G06F 1/266 |
| 9,866,239 B1* | 1/2018 | Smith | ............ | H03M 5/08 |
| 2003/0196540 A1* | 10/2003 | Ishii | ............ | G10H 1/0066 |
| | | | | 84/617 |
| 2004/0267483 A1* | 12/2004 | Percer | ............ | G06F 11/24 |
| | | | | 714/E11.154 |
| 2005/0021260 A1* | 1/2005 | Robertson | ............ | G01R 31/30 |
| | | | | 714/E11.154 |
| 2015/0381317 A1* | 12/2015 | Chard | ............ | H04L 1/0046 |
| | | | | 714/776 |
| 2016/0254902 A1* | 9/2016 | Nagase | ............ | G06F 1/325 |
| | | | | 375/333 |
| 2018/0287366 A1* | 10/2018 | Yeh | ............ | H02H 3/00 |
| 2018/0335819 A1* | 11/2018 | Waters | ............ | H02M 3/137 |
| 2020/0162065 A1* | 5/2020 | Wang | ............ | H03K 5/156 |

FOREIGN PATENT DOCUMENTS

| | | | | |
|---|---|---|---|---|
| CN | 107515836 A | 12/2017 | ............ | G06F 13/42 |
| CN | 111258944 A | 6/2020 | ............ | G06F 13/40 |

OTHER PUBLICATIONS

International Search Report and Written Opinion, Application No. PCT/US2021/054523, 10 pages, dated Feb. 8, 2022.

* cited by examiner

*Primary Examiner* — Idriss N Alrobaye
*Assistant Examiner* — Henry W Yu
(74) *Attorney, Agent, or Firm* — Slayden Grubert Beard PLLC

(57) ABSTRACT

An apparatus includes a bi-phase mark coded (BMC) input port configured to receive BMC signals from a universal serial bus (USB) cable. The apparatus further includes a threshold adjustment circuit configured to generate a threshold, and a comparator configured to compare an input BMC signal from the BMC input port and the threshold and based on the comparison, generate an adjusted input BMC signal. The threshold adjustment circuit is further configured to adjust the threshold based upon the input BMC signal.

15 Claims, 5 Drawing Sheets

AUTOMATIC THRESHOLD ADJUSTMENT FOR USB POWER DELIVERY TO WORK WITH CABLES OUT OF SPECIFICATION

FIELD OF THE INVENTION

The present disclosure relates to universal serial bus (USB) systems, and, more particularly, to automatic threshold adjustment for USB power delivery to work with cables out of specification.

BACKGROUND

USB cables may fail to meet specification requirements in order to follow a given USB specification. These failures may arise from mistakes in production, cable degradation, or other sources of change or interference.

Bi-phase mark coded (BMC) signals may be sent in USB communication through, for example, CC pins in a USB-C connector and cable. BMC signals may be used to communicate various information, such as information to support the USB Power Delivery (PD) specification.

PD is a protocol used by USB-C elements to negotiate power between each other. In PD, static voltages may be used to detect attachments, detect detachments, and provide other basic capabilities. Advanced capabilities may be communicated between USB-C elements using BMC signals. For example, the ability to query a country code may be performed through the use of BMC signals. The direct current (DC) voltage levels of communication, such as BMC signals, received at a given USB-C element from a connected, other USB-C element may vary according to current in the cabling between the USB-C elements. The current in a given USB-C cable may vary due to defects, degradation, or other deviations from the specification therein. The defects, degradation, or other deviations may cause changes to, for example, impedance of the USB-C cable. These changes in impedance may in turn change the current passing through the USB-C cable.

Some methods of addressing these variations in the BMC signals may including applying a switch and a capacitor into the CC wire connection, wherein received BMC signals are input to the switched capacitor to generate corrected BMC signals. However, inventors of embodiments of the present disclosure have discovered that because the BMC signal communication is performed at rates such as 300 kilobits per second, this may require a relatively large capacitor. Inventors of embodiments of the present disclosure have further discovered that this might not be practical for many USB applications. For example, some solutions may integrate a multiport USB hub onto a semiconductor die. In such a solution, using large capacitors may be prohibitively expensive.

SUMMARY

Embodiments of the present disclosure may include an apparatus. An apparatus may include a BMC input port configured to receive BMC signals from a USB cable. The apparatus may include a threshold adjustment circuit configured to generate a threshold. The apparatus may include a comparator configured to compare an input BMC signal from the BMC input port and the threshold, and based on the comparison, generate an adjusted input BMC signal. The threshold adjustment circuit may be further configured to adjust the threshold based upon the input BMC signal.

Embodiments of the present disclosure may include receiving BMC signals at a BMC input port from a USB cable, generating a threshold, comparing an input BMC signal from BMC input port and the threshold, generating an adjusted input BMC signal based on the comparison, and adjusting the threshold based upon the input BMC signal.

Embodiments of the present disclosure may include a USB element such as a USB host or device, including a BMC input port configured to receive BMC signals from a USB cable. The USB element may include a threshold adjustment circuit configured to generate a threshold. The USB element may include a comparator configured to compare an input BMC signal from the BMC input port and the threshold, and, based on the comparison, generate an adjusted input BMC signal. The threshold adjustment circuit may be further configured to adjust the threshold based upon the input BMC signal.

DETAILED DESCRIPTION

Figure 1:
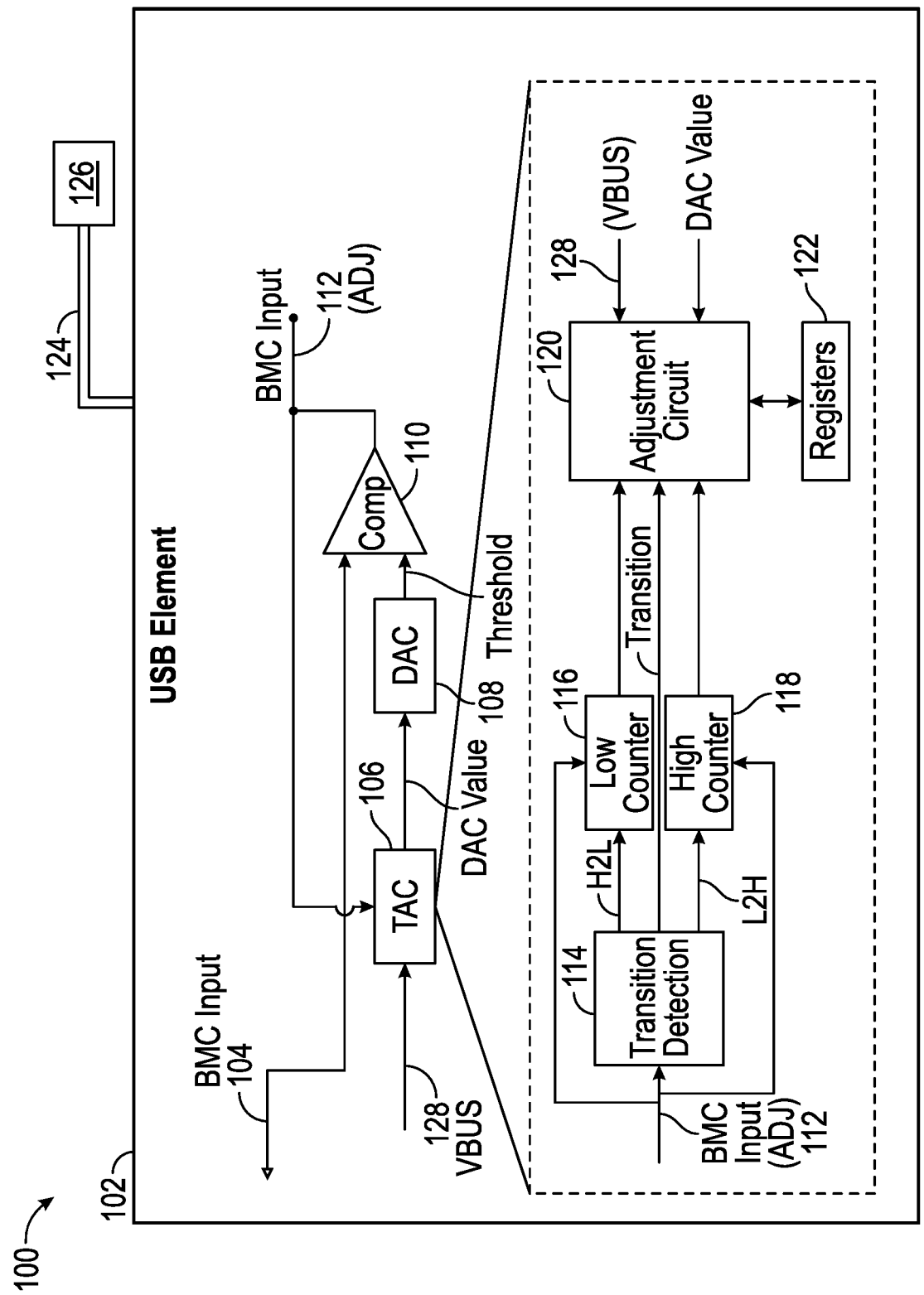
FIG. 1 is an illustration of a system 100 for adjusting a BMC signal, according to embodiments of the present disclosure.

Embodiments of the present disclosure may include an apparatus. The apparatus may be a USB element such as a USB device, host, hub, or any other suitable electronic device. The apparatus may include a BMC input port configured to receive BMC signals from a USB cable connected to the apparatus. The apparatus may include a threshold adjustment circuit implemented in any suitable manner, such as by analog circuitry, digital circuitry, instructions for execution by a processor, or any combination thereof. The apparatus may also include a comparator. The comparator may be configured to compare an input BMC signal from the BMC input port and the threshold and, based on the comparison, generate an adjusted input BMC signal. The threshold adjustment circuit may be further configured to adjust the threshold based upon the input BMC signal.

In combination with any of the above embodiments, the threshold adjustment circuit may be further configured to adjust the threshold based upon the input BMC signal through adjusting the threshold based upon the adjusted input BMC signal.

In combination with any of the above embodiments, the threshold adjustment circuit may be further configured to adjust the threshold based upon relative durations of logic high signals and logic low signals over a defined time length of the input BMC signal. The relative durations of logic high signals and logic low signals may be determined by, for example, counters. If the duration of logic high signals exceeds the duration of logic low signals, then the threshold may be raised. Otherwise, the threshold may be lowered.

In combination with any of the above embodiments, the threshold adjustment circuit may be further configured to raise or lower the threshold until the durations of logic high signals and logic low signals over a defined time length of the input BMC signal are approximately equal.

In combination with any of the above embodiments, the defined time length may be four bits of the input BMC signal.

In combination with any of the above embodiments, the threshold adjustment circuit may be further configured to determine whether the adjusted input BMC signal is idle, and, based on a determination that the adjusted input BMC is idle, adjust the threshold to an estimated threshold value.

In combination with any of the above embodiments, the threshold adjustment circuit may be further configured to determine the estimated threshold value by incrementally adjusting the threshold until the adjusted input BMC is no longer idle.

In combination with any of the above embodiments, the threshold adjustment circuit may be further configured to determine a current passing through the USB cable, determine an impedance of the USB cable, and determine the estimated threshold value by calculated the voltage resulting from the current and the impedance.

In combination with any of the above embodiments, the threshold adjustment circuit may be further configured to adjust the threshold based upon the input BMC signal through evaluation of the adjusted input BMC signal.

Embodiments of the present disclosure may include a USB element such as a USB host, USB device, or USB hub including any of the apparatuses of the above embodiments.

Embodiments of the present disclosure may include methods performed by any of the above USB elements or apparatuses.

FIG. 1 is an illustration of a system 100 for adjusting a BMC signal, according to embodiments of the present disclosure.

System 100 may include any suitable number and kind of elements connected physically through a cable 124. Such elements may include any suitable electronic device, such as USB elements. A given USB element may include, for example, a USB device or a USB host. In the example of FIG. 1, system 100 may include a USB element 102 connected through cable 124 to another USB element 126. USB elements 102, 126 may be implemented in a same or different manner. Cable 124 may be implemented in any suitable manner, and may be configured to carry any suitable number and kind of digital signals. For example, cable 124 may be implemented as a USB-C cable. Thus, USB elements 102, 126 may be configured to communicate with each other through USB-C connections. System 100 may be configured to adjust any such signals transmitted through cable 124. Such signals may include BMC signals. System 100 may be configured to adjust any such signals in individual ones of USB elements 102, 106.

USB element 102 may include a BMC input port 104. BMC input port 104 may provide BMC signals received through, for example, a CC pin on a USB connector for USB element 102 (not shown). Signals received through BMC input port 104 may be given as BMC input signals. The BMC signals may be received from, for example, USB element 126 over cable 124. The signals on BMC input port 104 may be adjusted by USB element 102 before being used by other portions (not shown) of USB element 102. The adjusted BMC signal may be given as BMC input (adj).

USB element 102 may include any suitable number and kind of elements to adjust the signal on BMC input port 104 to yield a BMC signal on a BMC input (adj) port 112. For example, USB element 102 may include a comparator 110. Comparator 110 may be implemented in any suitable manner to compare input signals and generate a comparison signal based upon the input signals. Comparator 110 may be configured to reissue the BMC signal from BMC input port 104 as a corrected digital signal through BMC input (adj) port 112 as a BMC input (adj) signal. Furthermore, comparator 110 may be configured to compare the signal from BMC input port 104 against a threshold value. If the signal from BMC input port 104 is greater than the threshold, comparator 110 may be configured to issue a logic high signal. Otherwise, if the signal from BMC input port 104 is less than the threshold, comparator 110 may be configured to issue a logic low signal. A hysteresis may be applied by comparator 110, wherein output of comparator 110 might not be changed unless the absolute difference between the signal from BMC input port 104 and the threshold is above a certain amount.

The threshold signal to be compared by comparator 110 with the signal from BMC input port 104 may be generated in any suitable manner. In one embodiment, USB element 102 may include a threshold adjustment circuit (TAC) 106. TAC 106 may be implemented in any suitable manner, such as with analog circuitry, digital circuitry, instructions for execution by a processor (not shown), or any combination thereof. Such instructions may be stored on a non-transitory, machine-readable medium (not shown). TAC 106 may be configured to dynamically generate and adjust the threshold value to be input to comparator 110. The adjustment may adjust the threshold value based upon changes to cable 124 that are manifested in signals received through cable 124 at USB element 102. TAC 106 may be configured to adjust the threshold value by receiving adjusted values of the BMC signal from BMC input (adj) port 112 routed back to TAC 106 in a feedback manner. Thus, the adjustment of the threshold value may be performed based upon the input signal on BMC input port 104, whether directly or indirectly. An initial value of the BMC signal on BMC input (adj) port 112 may be approximately equal or close to the initial signal on BMC input port 104. However, in cases when the initial threshold value is set too high or too low compared to the input signal on BMC input port 104, the output of comparator 110 may be held high or low.

TAC 106 may be configured to measure or track the relative or absolute duty cycles or time spent in a high or low logic level of the signal from BMC input (adj) port 112. TAC may use such measurements to adjust a threshold to be provided to adjustment circuit 120. The relative or absolute duty cycles may be a manifestation of changed impedances in cable 124. BMC signals may be sent using a balanced protocol wherein, for a given four sequential bits, the time or clock cycles spent at a logic high level are equal to the time or clock cycles spent at a logic low level. To identify variances from this expected behavior, TAC 106 may be configured to measure the time or clock cycles of the BMC signals spent at logic high ("high time") versus the time or clock cycles of the BMC signals spent at logic low ("low time"). TAC 106 may include any suitable implementation to track such time or clock cycles. Such time or clock cycles may be tracked in relative or absolute terms. Such time or clock cycles may be tracked for any suitable length of time, such as four consecutive bits.

TAC 106 may be configured to adjust the threshold value based upon relative durations of the high time and the low time. TAC 106 may be configured to repeatedly measure evaluate the relative durations of the high time and the low time. In one embodiment, TAC 106 may be configured to adjust the threshold up or down to make the relative durations of the high time and the low time closer in value. TAC 106 may be configured to repeatedly adjust (by raising or lowering) the threshold until the relative durations of the high time and the low time closer are approximately equal. Such an approximation of equality may be defined by a hysteresis value, such as 5% of the relative duration times. The specific comparison of high time versus low time, and whether such a comparison will result in raising or lowering the threshold, may depend upon the connections to or configurations of connector 110. For example, if connector 110 is configured to issue a one if the input signal is larger than the threshold, then the threshold may be raised when the input signal is larger than the threshold. If connector 110 is configured to instead issue a one if the threshold is larger than the input signal, then the threshold may be lowered when the threshold is larger than the input signal. The durations of the high time and the low time may be selected to be evaluated as received over a defined time length, such as by four bits of a BMC signal. Thus, TAC 106 may be configured to adjust the threshold based upon relative durations of logic high signals and logic low signals over a defined time length of the input BMC signal.

For example, in FIG. 1, If the high time of the BMC signal is greater than the low time of the BMC signal, then the threshold may be set too low. Thus, TAC 106 may be configured to raise the threshold. The threshold may be incremented in any suitable amount in a defined or variable step size. If the high time of the BMC signal is less than the low time of the BMC signal, then the threshold may be set too high. Thus, TAC 106 may be configured to lower the threshold. The threshold may be initially set to a value that assumes that the high time and low time is equal. A hysteresis may be used wherein if the absolute difference between the high time and the low time is less than a defined limit, TAC 106 might not change the threshold. This may prevent constant adjustment based on small differences in high time and low time. Whenever the BMC signal is idle, such as when several BMC cycles pass without a transition, the threshold may be reconfigured to the initial value. The threshold initial value, threshold step size, and hysteresis may all be configurable.

As discussed above, the threshold may be adjusted in a defined or variable step size. This may be given as a threshold adjustment step size. The threshold adjustment step size may be based upon the number of bits used to implement DAC 108. If, for example, DAC 108 is implemented using twelve bits, then DAC 108 may have 4,096 possible different output values. If the reference voltage of DAC 108 is, for example, 2.5 V, then each such output value may differ by 0.610 mV. The threshold adjustment step size may be quantified by a multiple of how many such output differences are to be used to achieve a given change in analog output. For example, TAC 106 may utilize a large threshold adjustment step size and a small threshold adjustment step size. TAC 106 may be configured to use the large threshold adjustment step size if the difference between low time and high time is great. TAC 106 may be configured to use the low threshold adjustment step size if the difference between low time and high time is small. The high threshold adjustment step size may be defined as, for example, 1.0 V, or 1640 steps of DAC 108. The low threshold adjustment step size may be defined as, for example, 0.25 V, or 410 steps of DAC 108.

A more detailed illustration of TAC 106 is further shown in FIG. 1. TAC 106 may include a transition detection circuit 114. Transition detection circuit 114 may be implemented in any suitable manner, such as with analog circuitry, digital circuitry, instructions for execution by a processor (not shown), or any combination thereof. Such instructions may be stored on a non-transitory, machine-readable medium (not shown).

TAC 106 may include counters, including low counter 116 and high counter 118. Counters 116, 118 may be implemented in any suitable manner, such as with analog circuitry, digital circuitry, instructions for execution by a processor (not shown), or any combination thereof. Such instructions may be stored on a non-transitory, machine-readable medium (not shown).

TAC 106 may include an adjustment circuit 120. Adjustment circuit 120 may be implemented in any suitable manner, such as with analog circuitry, digital circuitry, instructions for execution by a processor (not shown), or any combination thereof. Such instructions may be stored on a non-transitory, machine-readable medium (not shown).

Transition circuit 114 may be configured to receive the BMC signal from BMC input (adj) port 112. Transition circuit 114 may be configured to generate signals indicating that a transition from a high logic level to a low logic level, or from a low logic level to a high logic level, has occurred. For example, upon detecting a high to low transition or a low to high transition, transition circuit 114 may be configured to issue a signal to adjustment circuit 120 indicating than a transition has occurred. In another example, upon detecting a high to low transition, transition circuit 114 may be configured to issue a signal to low counter 116 indicating than a high to low transition has occurred. In yet another example, upon detecting a low to high transition, transition circuit 114 may be configured to issue a signal to high counter 118 indicating than a low to high transition has occurred.

Low counter 116 may be configured to count time or clock cycles between high to low transitions of the signals of the BMC signal. Low counter 116 may be configured to receive the BMC signal from BMC input (adj) port 112. Low counter 116 may be reset by receiving a signal from transition circuit 114. Low counter 116 may provide its count to adjustment circuit 120. The count of low counter 116 may be provided to adjustment circuit 120, for example, continuously or upon receiving the signal from transition circuit 114. Thus, low counter 116 may be configured to provide a representation of low time.

High counter 118 may be configured to count time or clock cycles between low to high transitions of the signals of the BMC signal. High counter 118 may be configured to receive the BMC signal from BMC input (adj) port 112. High counter 118 may be reset by receiving a signal from transition circuit 114. High counter 118 may provide its count to adjustment circuit 120. The count of high counter 118 may be provided to adjustment circuit 120, for example, continuously or upon receiving the signal from transition circuit 114. Thus, high counter 118 may be configured to provide a representation of high time.

Adjustment circuit 120 may be configured to receive the representations of low time and high time from counters 116, 118. Adjustment circuit 120 may be configured to generate any suitable representation of an adjusted threshold level. The representation may be, for example, a digital representation. In such a case, the digital representation may be provided to a DAC 108. DAC 108 may be implemented by any suitable combination of analog circuitry, digital circuitry, instructions for execution by a processor (not shown). Such instructions may be stored on a non-transitory, machine-readable medium (not shown). DAC 108 may be configured to provide an analog signal to comparator 110. The analog signal may be generated from the digital representation received from adjustment circuit 120.

Adjustment circuit 120 may be configured to access any suitable memory or information to determine operational parameters. For example, adjustment circuit 120 may be configured to access registers 122. Registers 122 may store settings created during manufacture of TAC 106 or set by users of TAC 106. Registers 122 may reside in any suitable portion of USB element 102. The operational parameters may include, for example, a default threshold value, a threshold adjustment step size, a hysteresis parameter, idle time, or any other suitable parameter.

By default, adjustment circuit 120 may be configured to issue a digital representation of the default threshold value. Based upon input from the BMC signal, adjustment circuit 120 may be configured to adjust the digital representation of the threshold value, up or down, by an amount defined by the threshold adjustment step size. Adjustment circuit 120 may be configured to store the threshold value from iteration to iteration of operation.

Adjustment circuit 120 may be configured to determine, from values received from counters 116, 118, the low time and the high time of BMC signals. Adjustment circuit 120 may be configured to evaluate values low time and high time for any suitable sample period, such as over four BMC bit pulses. Adjustment circuit 120 may be configured to compare the high time and low time. If the high time is greater than the low time, then adjustment circuit 120 may be configured to raise the threshold by the threshold adjustment step size. If the high time is less than the low time, adjustment circuit 120 may be configured to lower the threshold by the threshold adjustment step size.

Adjustment circuit 120 may be configured to delay, postpone, or otherwise not adjust the threshold value if the high time and low time input from the BMC signal are not sufficiently different, even if not equal, to a degree defined by the hysteresis parameter.

After a period of time defined by the idle time without any changed input on the BMC signal, adjustment circuit 120 may be configured to reset the threshold value to the default threshold value.

Figure 2:
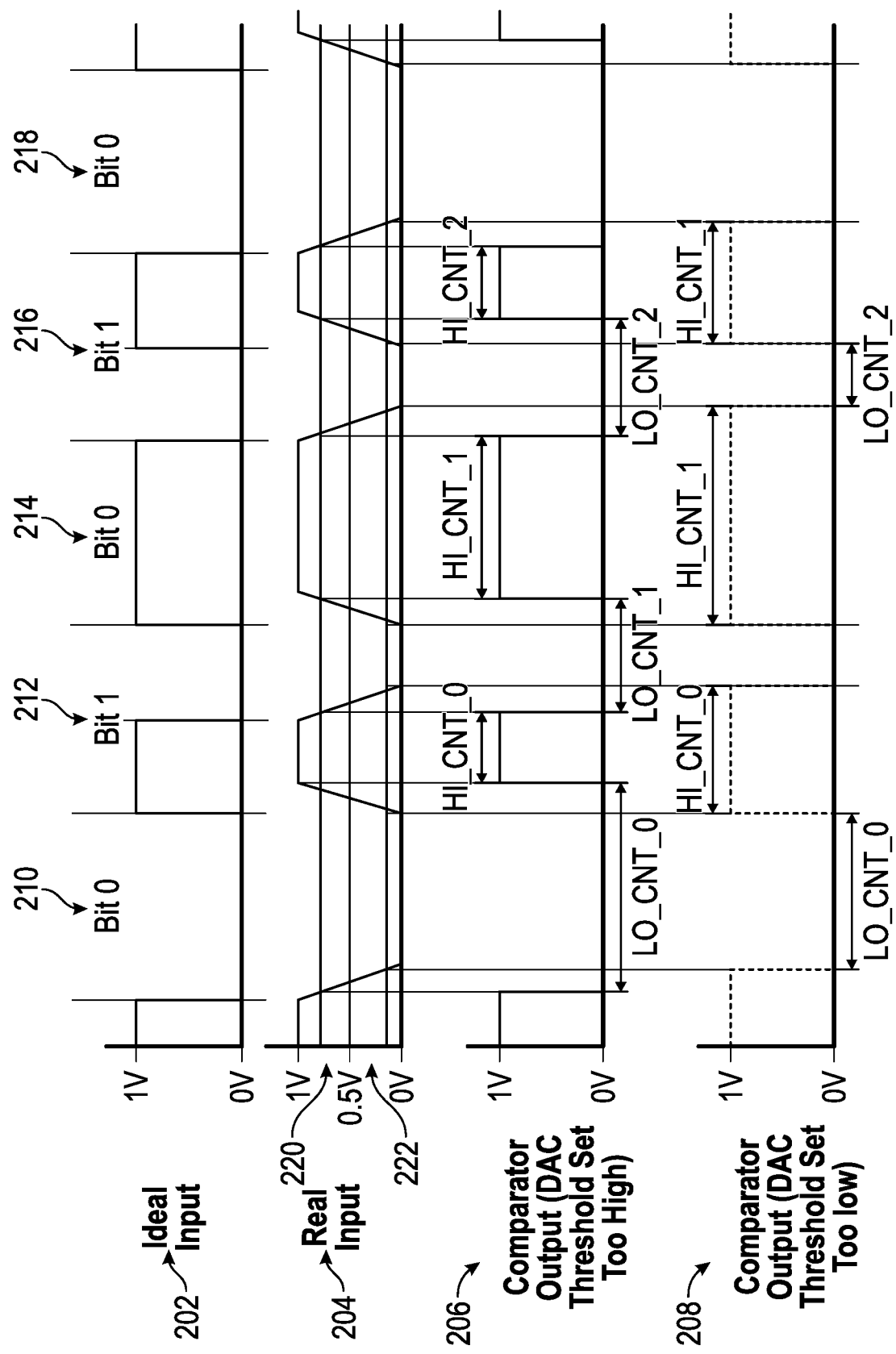
FIG. 2 is an illustration of timing diagrams for BMC signal detection, according to embodiments of the present disclosure.

FIG. 2 is an illustration of timing diagrams for BMC signal detection, according to embodiments of the present disclosure. FIG. 2 may illustrate operation of various portions of FIG. 1.

A graph 202 of an ideal input is shown. Such an input may be an idealized version of the BMC signal. Also shown is a graph 204 of the real BMC signal. Graph 206 illustrates output of comparator 110 when the threshold from TAC 106 as-provided by DAC 108 is too high. Graph 208 illustrates output of comparator 110 when the threshold from TAC 106 as-provided by DAC 108 is too low.

As show in the ideal input in graph 202, a falling edge of the BMC signal may initiate transmission of a first bit. Subsequent transitions of rising edges and falling edges may constitute transmission of additional bits. Five bits are shown in FIG. 2. TAC 106 may be configured to evaluate the high time and the low time of the first four bits shown. The first bit, 210 may be considered a "0". The next bit, 212, may be considered a "1". The next bit, 214, may be considered a "0". The next bit, 216, may be considered a "1". Another bit, 218, might not be used for the purposes of evaluating the threshold in this example. As illustrated in FIG. 2, over the sequence of the four bits 210, 212, 214, 216, the time spent in high time and low time may be equal. In a given bit, the time spent in high time and low time might not be equal. For example, all of bit 210 may be spent in low time. However, over the span of the four bits 210, 212, 214, 216, the low time of bit 210 is matched by high time in other bits.

In graph 204, representations (not to scale) are shown of how the ideal input of graph 202 is typically manifested in actual input of the BMC signal. As the BMC signal transitions from high to low or from low to high, achieving the full transition may take some amount of time. USB element 102, through comparator 110, may be configured to compare a threshold to the actual input the BMC signal to determine when the transition has occurred. The selection of the threshold may affect the resultant output of comparator 110. If the threshold is set too high or too low, the resultant output of comparator 110 may reflect a difference between high time and low time over a four-bit sequence. Such a threshold value may be the result of defects or impedance changes on cable 124.

In graph 204, example thresholds are illustrated. A first threshold 220 may be set too high. A second threshold 222 may be set too low. Such phenomena may be illustrated in graphs 206, 208.

Graph 206 may illustrate output of comparator 110 given a threshold value according to the first threshold 220. As shown in graph 204, in bit 210 when real input of the BMC signal falls below the first threshold 220, comparator 110 may issue a zero or logic low output as shown in graph 206. Upon the rise of input of the BMC signal 104, when such input rises above the first threshold 220, comparator 110 may issue a one or logic high output as shown in graph 206. Similar behavior may occur for bits 212, 214, 216.

During bit 210, low counter 116 may issue an indication of time given by LO_CNT_0 to adjustment circuit 120. During bits 212 and 214, low counter 116 may issue an indication of time given by LO_CNT_1 to adjustment circuit 120. During bit 216, low counter 116 may issue an indication of time given by LO_CNT_2 to adjustment circuit 120. The low time for input of the BMC signal over the sequence of bits 210, 212, 214, 216 may be the sum of LO_CNT_0, LO_CNT_1, and LO_CNT_2.

During bit 212, high counter 118 may issue an indication of time given by HI_CNT_0 to adjustment circuit 120. During bit 214, high counter 118 may issue an indication of time given by HI_CNT_1 to adjustment circuit 120. During bit 216, high counter 118 may issue an indication of time given by HI_CNT_1 to adjustment circuit 120. The high time for the BMC signal over the sequence of bits 210, 212, 214, 216 may be the sum of HI_CNT_0, HI_CNT_1, and HI_CNT_2.

As shown in graph 206, as the value of first threshold 220 is set too high, an imbalance between the low time and the high time may occur. Specifically, the high time is less than the low time. The low time of bit 210 extends into what otherwise would be high time of bit 212. Similarly, the high time of bit 212 ends early relative to the low time of bit 212. Similarly, the high time of bit 214 and bit 216 are shortened. Based upon the occurrence of the behavior of graph 206, wherein high time is less than low time, adjustment circuit 120 may be configured to lower the first threshold by the threshold step size.

Graph 208 may illustrate output of comparator 110 given a threshold value according to the second threshold 222. As shown in graph 204, in bit 210 when real input of the BMC signal falls below the second threshold 222, comparator 110 may issue a zero or logic low output as shown in graph 206. Upon the rise of the BMC signal, when the BMC input 104 rises above the second threshold 222, comparator 110 may issue a one or logic high output as shown in graph 206. Similar behavior may occur for bits 212, 214, 216.

As discussed above, during bit 210, low counter 116 may issue an indication of time given by LO_CNT_0 to adjustment circuit 120. During bits 212 and 214, low counter 116 may issue an indication of time given by LO_CNT_1 to adjustment circuit 120. During bit 216, low counter 116 may issue an indication of time given by LO_CNT_2 to adjustment circuit 120. The low time for input of the BMC signal over the sequence of bits 210, 212, 214, 216 may be the sum of LO_CNT_0, LO_CNT_1, and LO_CNT_2. During bit 212, high counter 118 may issue an indication of time given by HI_CNT_0 to adjustment circuit 120. During bit 214, high counter 118 may issue an indication of time given by HI_CNT_1 to adjustment circuit 120. During bit 216, high counter 118 may issue an indication of time given by HI_CNT_1 to adjustment circuit 120. The high time for input of the BMC signal over the sequence of bits 210, 212, 214, 216 may be the sum of HI_CNT_0, HI_CNT_1, and HI_CNT_2.

As shown in graph 208, as the value of second threshold 222 is set too low, an imbalance between the low time and the high time may occur. Specifically, the high time is treater than the low time. The low time of bits 212 and 216 are shortened relative to high time in such bits. Based upon the occurrence of the behavior of graph 208, wherein high time is greater than low time, adjustment circuit 120 may be configured to raise the first threshold by the threshold step size.

Figure 3:
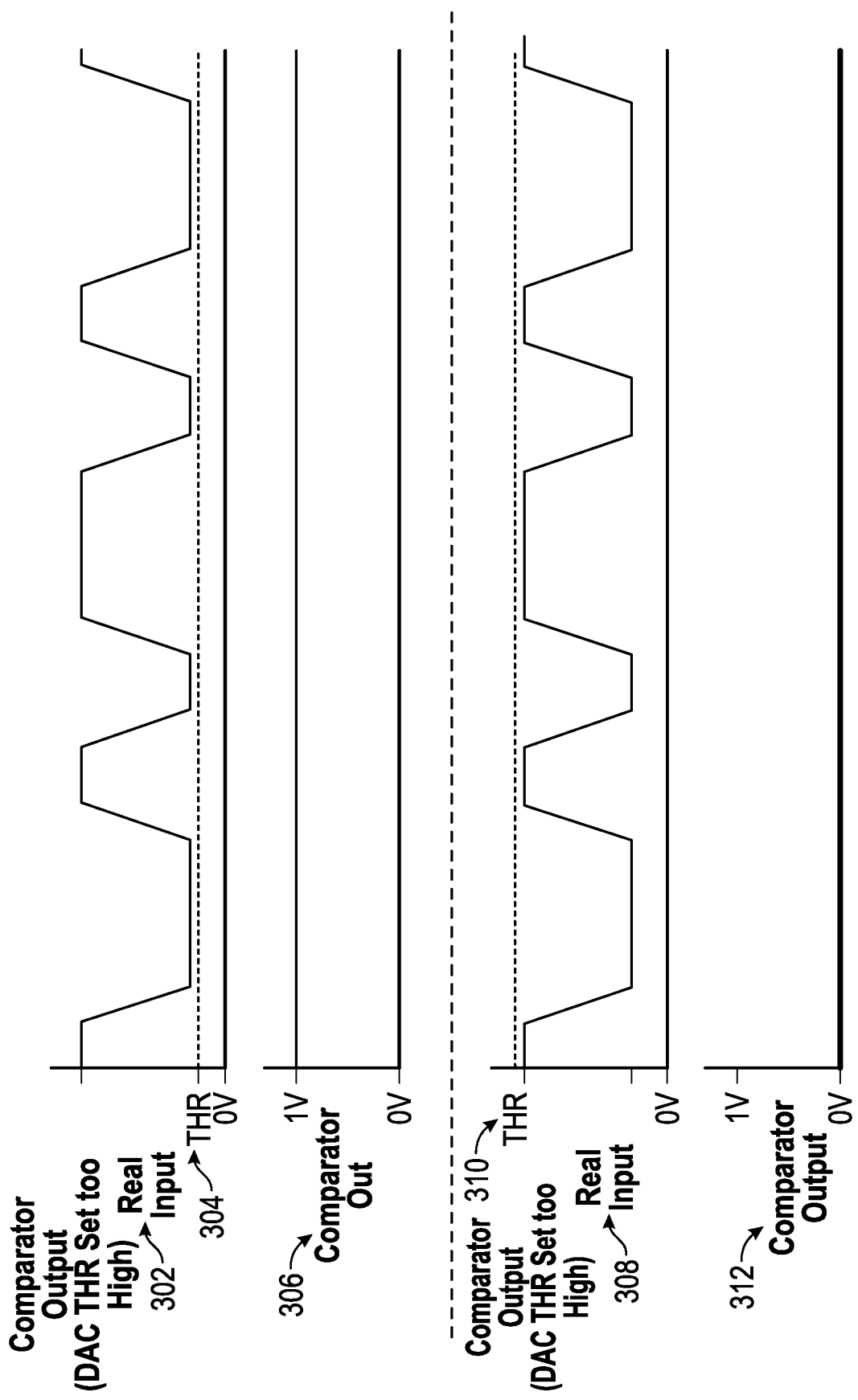
FIG. 3 illustrates conditions for which additional steps may be taken to accommodate in order to perform adjusting a BMC signal, according to embodiments of the present disclosure.

FIG. 3 illustrates conditions for which additional steps may be taken to accommodate in order to perform adjusting a BMC signal, according to embodiments of the present disclosure.

Inventors of embodiments of the present disclosure have discovered that the approach shown and described in FIGS. 1-2 might not account for all situations caused by faulty cables. If the operating parameters of cable 124 are fairly close to those required by the USB specification, adjustments as shown in FIGS. 1-2 may be sufficient to account for operating parameters of cable 124 that are nonetheless imperfect or out of the USB specification. In such cases, the imperfections of cable 124 might cause a DC shift that can be accounted for by adjusting the threshold. However, imperfections in cable 124 may cause such large amounts of DC shift that comparator 110 cannot make an effective comparison between input of the BMC signal and a threshold generated by TAC 106 and DAC 108. The input of the BMC signal might never be observed rising above or below the threshold, and thus comparator 110 might not reissue BMC pulses on BMC input (adj) port 112. Instead, comparator 110 would have a constant output.

In FIG. 3, graph 302 may illustrate real input of a BMC signal of the BMC signal. Such a BMC signal may arise from transmission through an instance of cable 124 that is far outside the USB specification, and thus may be experiencing a large DC shift. In the example of graph 302, the BMC signal is shifted such that it is entirely above a threshold 304. In such a case, output of comparator 110, illustrated in graph 306, may be constantly high, as the input of the BMC signal as shown in graph 302 is always greater than threshold 304. Such an output of comparator 110 may fail to properly generate any BMC signals, much less correctly adjusted BMC signals.

Similarly, graph 308 may illustrate real input of a different BMC signal of the BMC signal. Such a BMC signal may also arise from transmission through an instance of cable 124 that is far outside the USB specification, and thus may also be experiencing a large DC shift. In the example of graph 308, the BMC signal is shifted such that it is entirely below a threshold 310. In such a case, output of comparator 110, illustrated in graph 312, may be constantly low, as the input of the BMC signal as shown in graph 308 is always less than threshold 310. Such an output of comparator 110 may fail to properly generate any BMC signals, much less correctly adjusted BMC signals.

Returning to FIG. 1, in one embodiment, in order to adjust a BMC signal in view of such a DC shift as shown in FIG. 3, TAC 106, through configuration of adjustment circuit 120, may be configured to apply further threshold adjustments when output on BMC input (adj) port 112 is idle. As discussed above, if cable 124 is sufficiently out of specification, the input of the BMC signal may be always greater or always less than the threshold generated by TAC 106, thus yielding a constant output of comparator 110. Thus, output of comparator 110 may be routed in feedback to TAC 106. Inside of TAC 106, output of comparator 110 may be routed to adjustment circuit 120. Adjustment circuit 120 may be configured to determine whether output of comparator 110 has been idle, wherein its value has been unchanged, for a given period of time. The period of time may be defined in registers 122. If no transitions in output of comparator 110 are observed for the given period of time, and if the signal of the BMC signal is not idle, then a significant DC shift such as those shown in FIG. 3 may have occurred.

In such a case, adjustment circuit 120 may be configured to search for an estimated threshold value that will cause comparator 110 to generate transitions of a BMC signal. Adjustment circuit 120 may be configured to vary the threshold value by, for example, the threshold adjustment step, and then observe whether output of comparator 110 is still idle. If output of comparator 110 is still idle, then adjustment circuit 120 may be configured to again vary the threshold value. The threshold value may be varied in any suitable manner, such as applying yet another threshold adjustment step. Once output of comparator 110 is not idle, the threshold value that caused output of comparator 110 to no longer be idle may be set as the initial threshold value from which adjustment circuit 120 may perform adjustments. This may be performed until low time and high time of input of the BMC signal are equal for four consecutive bits. The search for the threshold value may be performed by setting the threshold at, for example, zero volts or another minimum value, then incrementing the threshold value by the threshold adjustment step during each iteration. In another example, the search may be performed by setting the threshold at a maximum voltage, then decrementing the threshold value by the threshold adjustment step during each iteration. Thus, adjustment circuit 120 may be configured to determine the estimated threshold value through a search that includes incrementally adjusting the threshold until output of comparator 110—and thus BMC input signal (adj) 112—is no longer idle.

In another embodiment, in order to adjust a BMC signal in view of such a DC shift as shown in FIG. 3, TAC 106, through configuration of adjustment circuit 120, may be configured to calculate an estimated nominal voltage from cable 124, from which adjustments may be further made. This estimation may be performed in any suitable manner. In one embodiment, current through cable 124 may be measured and used to calculate the estimated nominal voltage. Current through cable 124 may be measured in any suitable manner. For example, current through cable 124 may be measured or monitored on a VBUS pin 124. Based on the current drawn or sent through cable 124 through VBUS pin 124, the voltage of cable 124 may be estimated. Such an estimation may further need an impedance of cable 124. An impedance, such as nominal or expected impedance, of cable 124 may be used. However, as cable 124 has an impedance that has varied from the USB specification—and thus varied from its own expected impedance—a voltage calculated based upon such an impedance might be an initial threshold value from which further adjustments may be made, as described above.

Figure 4:
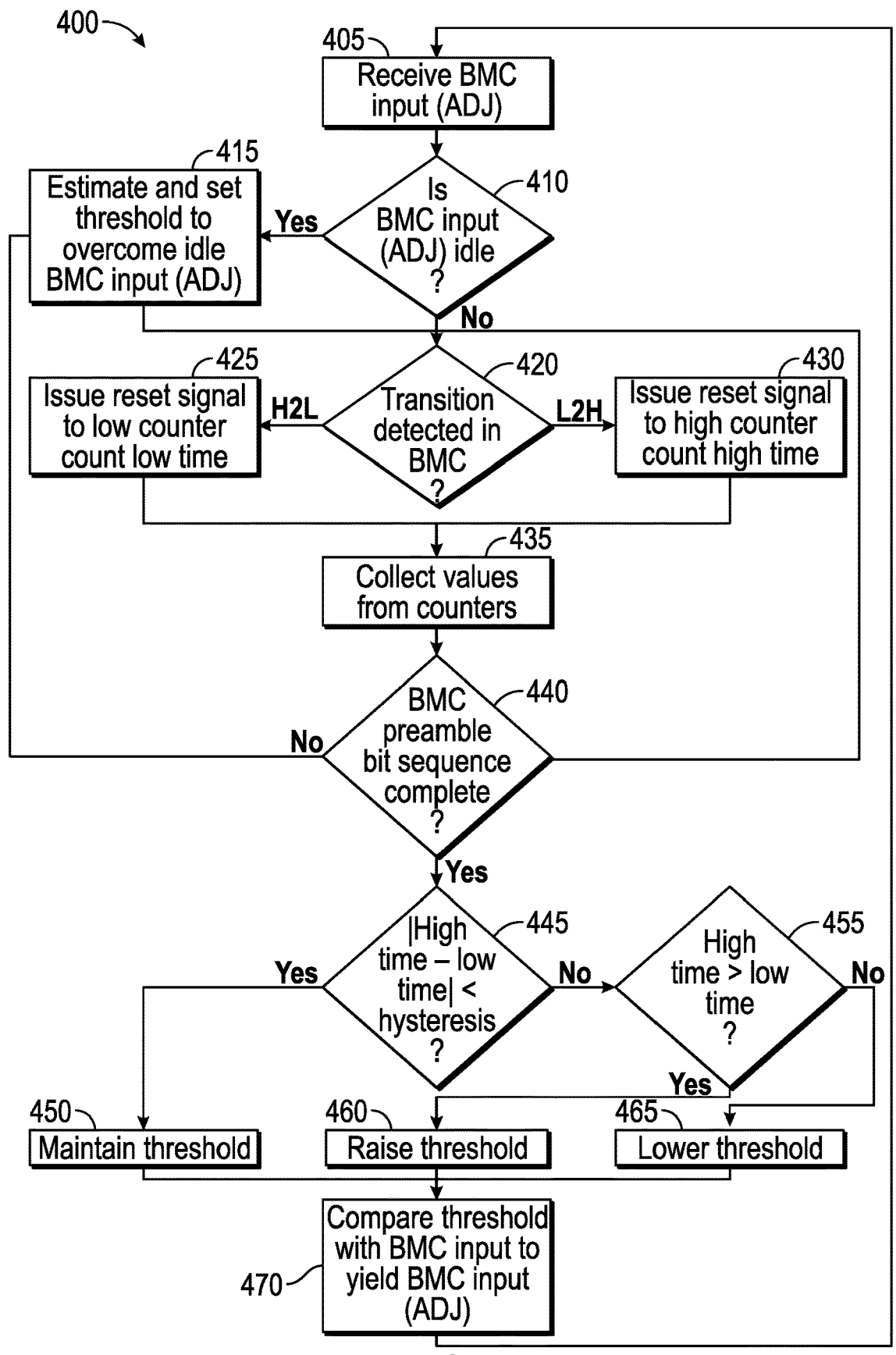
FIG. 4 is an illustration of a flow chart of an example method 400 for adjusting a BMC signal, according to embodiments of the present disclosure.

FIG. 4 is an illustration of a flow chart of an example method 400 for adjusting a BMC signal, according to embodiments of the present disclosure. Method 400 may be implemented by any suitable mechanism, such as the elements of FIGS. 1-3. In particular, method 400 may be implemented by TAC 106. Method 400 may be performed with fewer or more steps than those illustrated in FIG. 4. Moreover, certain steps may be omitted, repeated, performed in a different order than illustrated, performed in parallel, or performed recursively. Method 400 may start upon any suitable initialization condition, such as power-up and initialization of TAC 106, or upon demand from a user or a larger system. Method 400 may repeat as necessary.

At step 405, a BMC input, such as that on BMC input port 104 or BMC input (adj) port 112, may be received at a USB element such as USB element 102. The BMC input may be transmitted to the USB element through a cable, such as cable 124. An initial threshold, threshold adjustment step, idle times, or any other suitable parameters may be loaded, if necessary and if these have not already been loaded. Upon repeated execution of method 400, the initial threshold may be a previously set threshold, such as that discussed in steps 450, 460, 465, discussed in further detail below.

At step 410, it may be determined whether an output of method 400, including an adjusted BMC input such as through BMC input (adj) port 112, is idle. Such a determination may be made if there have been no transitions in the adjusted BMC input generated as an output of method 400 for a defined period of time or a number of clock cycles. If the adjusted BMC input is idle, method 400 may proceed to step 415. Otherwise, method 400 may proceed to step 420. Step 410 may be performed by, for example, adjustment circuit 120.

At step 415, an adjusted threshold sufficient to overcome the idle condition determined in step 410 may be identified, yielding an estimated threshold value. Any suitable process may be used to identify such an adjusted threshold. For example, method 500 illustrated in FIG. 5, or method 600 illustrated in FIG. 6, below, may be used to implement step 415. Such an adjusted threshold may be adjusted from the initial threshold discussed above in step 405. The adjusted threshold may be set and method 400 may proceed to step 420. Step 415 may be performed by, for example, adjustment circuit 120.

At step 420, a transition in the BMC input may be detected. The transition may be a high to low transition, or a low to high transition. If the transition is a high to low transition, method 400 may proceed to step 425. Step 420 may be performed by, for example, for example, transition detection circuit 114.

At step 425, a reset signal may be issued to a low counter, such as low counter 116. The reset signal may cause the low counter to start counting a period of low time. A stop signal may be issued to a high counter, such as high counter 118, causing the high counter to stop counting high time. This may be performed by, for example, for example, transition detection circuit 114.

At step 430, a reset signal may be issued to a high counter, such as high counter 118. The reset signal may cause the high counter to start counting a period of high time. A stop signal may be issued to a low counter, such as low counter 116, causing the low counter to stop counting low time. This may be performed by, for example, for example, transition detection circuit 114.

At step 435, values may be collected from the counters. The values may be collected, for example, upon the stoppage of a given counter. The values may be collected at, for example, adjustment circuit 120. The adjustment circuit may tabulate collected high time and low time for a given bit sequence. Step 435 may be performed by, for example, adjustment circuit 120.

At step 440, it may be determined whether the preamble bit sequence of the BMC input signal is complete. Such a bit sequence may be, for example, four bits long. If the bit sequence is complete, method 400 may proceed to step 445. Otherwise, method 400 may return to step 420. Step 440 may be performed by, for example, adjustment circuit 120.

At step 445, it may be determined whether the absolute difference between the low time and the high time is greater than a given limit. This limit may represent a hysteresis, wherein small differences between the high time and the low time do not cause a change in output of a threshold. This limit may be, for example, 5% of the difference between the logic high and logic low output values. Step 445 may be performed by, for example, adjustment circuit 120. If the absolute difference between the low time and the high time is greater than a given limit, method 400 may proceed to step 450. Otherwise, method 400 may proceed to step 455.

At step 450, the existing threshold may be maintained. Method 400 may proceed to step 470. Step 450 may be performed by, for example, adjustment circuit 120.

At step 455, it may be determined whether the high time of the BMC signal during the bit sequence was less than the low time of the BMC signal during the bit sequence. If so, method 400 may proceed to step 460. Otherwise, method 400 may proceed to step 465. Step 4655 may be performed by, for example, adjustment circuit 120.

At step 460, the threshold may have been too low. Thus, the threshold may be raised. The threshold may be raised by the threshold adjustment step size. Method 400 may proceed to step 470. Step 460 may be performed by, for example, adjustment circuit 120.

At step 465, the threshold may have been too high. Thus, the threshold may be lowered. The threshold may be lowered by the threshold adjustment step size. Method 400 may proceed to step 470. Step 465 may be performed by, for example, adjustment circuit 120.

At step 470, the threshold may be compared with BMC input. If the BMC input is greater than the threshold, then BMC input (adj) may be issued as a logic high. If the BMC input is less than the threshold, then BMC input (adj) may be issued as a logic low. Method 400 may return to, for example, step 405. Step 470 may be performed by, for example, comparator 110.

Figure 5:
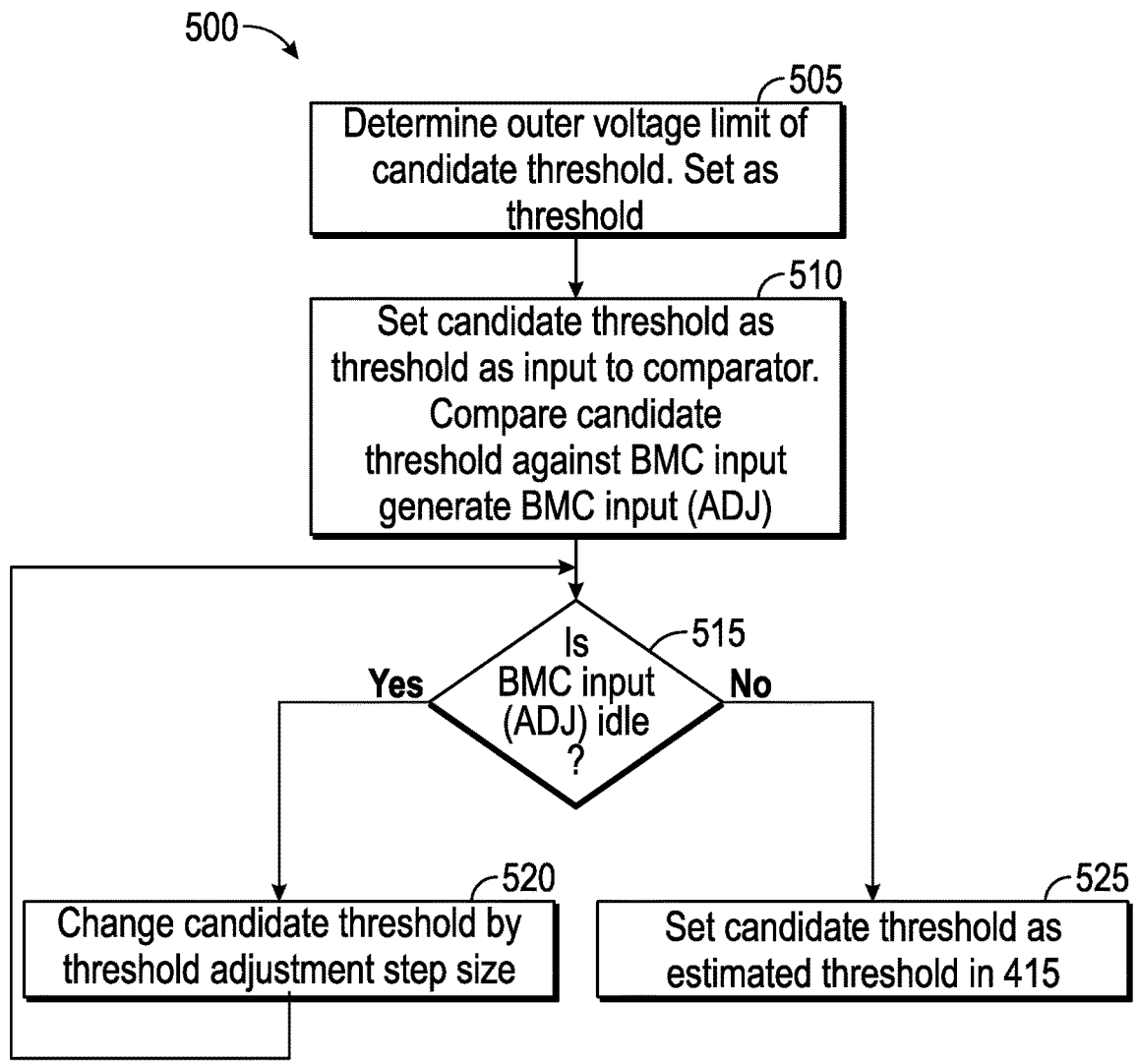
FIG. 5 is an illustration of a flow chart of an example method 500 for searching for an estimated threshold value, according to embodiments of the present disclosure.

FIG. 5 is an illustration of a flow chart of an example method 500 for searching for an estimated threshold value, according to embodiments of the present disclosure. Method 500 may implement step 415 of FIG. 4. Method 500 may be implemented by any suitable mechanism, such as the elements of FIGS. 1-3. In particular, method 500 may be implemented by TAC 106. Method 500 may be performed with fewer or more steps than those illustrated in FIG. 5. Moreover, certain steps may be omitted, repeated, performed in a different order than illustrated, performed in parallel, or performed recursively. Method 500 may repeat as necessary.

At step 505, an outer limit of a possible value of the threshold may be determined. Such an outer limit may be a maximum or a minimum value. This outer limit may be set as a candidate threshold to be used to compare against BMC input to generate BMC input (adj). Step 505 may be performed by, for example, adjustment circuit 120.

At step 510, the candidate threshold may be compared against BMC input to generate BMC input (adj). Step 510 may be performed by, for example, comparator 110. The candidate threshold and BMC input may be compared, and a BMC input (adj) generated. Step 510 may be performed a sufficient number of times to determine whether BMC input (adj) is idle, which may depend upon an idle time setting. Step 510 may be performed by, for example, comparator 110.

At step 515, it may be determined whether BMC input (adj) is idle. The determination may be made if BMC input (adj) has remained unchanged for an amount of time or cycles identified by, for example, an idle time setting. Step 515 may be performed by, for example, comparator 110. If BMC input (adj) is idle, method 500 may proceed to step 520. Otherwise, method 500 may proceed to step 525.

At step 520, the candidate threshold may be changed by an amount such as the threshold adjustment step size. The threshold may be changed up or down, depending upon from what voltage the search began. For example, if the outer limit of step 505 was a maximum voltage, the candidate threshold may be lowered by the threshold adjustment step size. In other words, the search for the threshold starts with high voltages and searches through incrementally lower voltages. If the outer limit of step 501 was a minimum voltage, the candidate threshold may be raised by the threshold adjustment step size. In other words, the search for the threshold starts with low voltages and searches through incrementally higher voltages. Method 500 may return to step 515. Step 520 may be performed by, for example, adjustment circuit 120.

At step 525, the candidate threshold may be set as the estimated threshold to be determined by step 415 in method 400 and may be subsequently used as a threshold for further adjustments therein. Step 525 may be performed by, for example, adjustment circuit 120.

Figure 6:
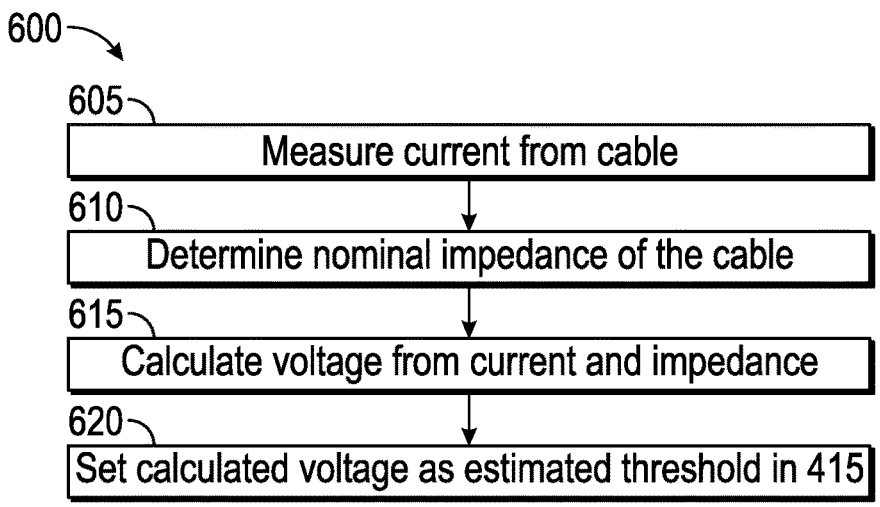
FIG. 6 is an illustration of a flow chart of an example method 600 for calculating an estimated threshold value, according to embodiments of the present disclosure.

FIG. 6 is an illustration of a flow chart of an example method 600 for calculating an estimated threshold value, according to embodiments of the present disclosure. Method 600 may implement step 415 of FIG. 4. Method 600 may be implemented by any suitable mechanism, such as the elements of FIGS. 1-3. In particular, method 600 may be implemented by TAC 106 and, specifically, adjustment circuit 120. Method 600 may be performed with fewer or more steps than those illustrated in FIG. 6 Moreover, certain steps may be omitted, repeated, performed in a different order than illustrated, performed in parallel, or performed recursively. Method 600 may repeat as necessary.

At step 605, current from a cable, such as cable 124, connected to a USB element, such as USB element 102, may be measured. The measurement may be through, for example, a VBUS pin.

At step 610, nominal impedances for the cable may be determined. Such impedances may depend on the type, manufacture, or length of the cable. The impedances may be stored in registers or memory and the cable identified in any suitable manner.

At step 615, the voltage of the cable resulting from the current and the impedance of the cable may be calculated by multiplying the current and the nominal impedance.

At step 620, the voltage of the cable may be set as the estimated threshold to be determined by step 415 in method 400 and may be subsequently used as a threshold for further adjustments therein.

Although example embodiments have been described above, other variations and embodiments may be made from this disclosure without departing from the spirit and scope of these embodiments.

We claim:

1. An apparatus, comprising:
a bi-phase mark coded (BMC) input port to receive BMC signals from a universal serial bus (USB) cable;
a threshold adjustment circuit to generate a voltage threshold;
and
a comparator to:
compare an input BMC signal from the BMC input port and the voltage threshold; and
based on the comparison, generate an adjusted input BMC signal;
wherein the threshold adjustment circuit is to
adjust the voltage threshold based upon the input BMC signal through evaluation of the adjusted input BMC signal;
determine whether the adjusted input BMC signal is idle; and
based on a determination that the adjusted input BMC is idle, adjust the voltage threshold to an estimated voltage threshold value.

2. The apparatus of claim 1, wherein the threshold adjustment circuit is to adjust the voltage threshold based upon relative durations of logic high signals and logic low signals over a defined time length of the input BMC signal.

3. The apparatus of claim 2, wherein the threshold adjustment circuit is to raise or lower the voltage threshold until the durations of logic high signals and logic low signals over a defined time length of the input BMC signal are approximately equal.

4. The apparatus of claim 3, wherein the defined time length is four bits of the input BMC signal.

5. The apparatus of claim 1, wherein threshold adjustment circuit is to determine the estimated voltage threshold value by incrementally adjusting the voltage threshold until the adjusted input BMC is no longer idle.

6. The apparatus of claim 1, wherein threshold adjustment circuit is to:
determine a current passing through the USB cable;
determine an impedance of the USB cable; and
determine the estimated voltage threshold value by a calculation of a voltage resulting from the current and the impedance.

7. A method, comprising:
receiving bi-phase mark coded (BMC) signals at a BMC input port from a universal serial bus (USB) cable;
generating a voltage threshold;
comparing an input BMC signal from BMC input port and the voltage threshold;
based on the comparison, generating an adjusted input BMC signal;
adjusting the voltage threshold based upon the input BMC signal;

determining whether the adjusted input BMC signal is idle; and based on a determination that the adjusted input BMC is idle, adjusting the voltage threshold to an estimated voltage threshold value;

wherein adjusting the voltage threshold based on the input BMC signal includes evaluating the adjusted input BMC signal.

8. The method of claim 7, wherein the voltage threshold is adjusted based upon relative durations of logic high signals and logic low signals over a defined time length of the input BMC signal.

9. The method of claim 8, wherein the voltage threshold is adjusted by raising or lowering the voltage threshold until the durations of logic high signals and logic low signals over a defined time length of the input BMC signal are approximately equal.

10. The method of claim 9, wherein the defined time length is four bits of the input BMC signal.

11. The method of claim 7, comprising determining the estimated voltage threshold value by incrementally adjusting the voltage threshold until the adjusted input BMC is no longer idle.

12. The method of claim 7, comprising:
determining a current passing through the USB cable;
determining an impedance of the USB cable; and
determining the estimated voltage threshold value by calculated the voltage resulting from the current and the impedance.

13. A universal serial bus (USB) element, comprising:
a bi-phase mark coded (BMC) input port to receive BMC signals from a USB cable;
a threshold adjustment circuit to generate a voltage threshold; and
a comparator to:
compare an input BMC signal from the BMC input port and the voltage threshold; and
based on the comparison, generate an adjusted input BMC signal;
wherein the threshold adjustment circuit is to;
adjust the voltage threshold based upon the input BMC signal through evaluation of the adjusted input BMC signal;
determine whether the adjusted input BMC signal is idle; and
based on a determination that the adjusted input BMC is idle, adjust the voltage threshold to an estimated voltage threshold value.

14. The USB element of claim 13, wherein the threshold adjustment circuit is to adjust the voltage threshold based upon relative durations of logic high signals and logic low signals over a defined time length of the input BMC signal.

15. The USB element of claim 14, wherein the threshold adjustment circuit is to raise or lower the voltage threshold until the durations of logic high signals and logic low signals over a defined time length of the input BMC signal are approximately equal.

* * * * *